US008382885B2

(12) United States Patent
Ho et al.

(10) Patent No.: US 8,382,885 B2
(45) Date of Patent: Feb. 26, 2013

(54) FLUID FILTRATION FOR SUBSTRATE PROCESSING CHAMBER

(75) Inventors: Dustin W. Ho, Fremont, CA (US); Juan Carlos Rocha-Alvarez, San Carlos, CA (US); Hichem M'Saad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 166 days.

(21) Appl. No.: 12/914,822

(22) Filed: Oct. 28, 2010

(65) Prior Publication Data

US 2011/0256041 A1  Oct. 20, 2011

Related U.S. Application Data

(60) Provisional application No. 61/255,825, filed on Oct. 28, 2009.

(51) Int. Cl.
*B01D 53/02* (2006.01)

(52) U.S. Cl. ............... 96/134; 95/117; 95/132; 423/210; 210/172.6; 210/321.6; 210/650; 422/187

(58) Field of Classification Search ............... 95/117, 95/132; 96/134; 423/210; 210/172.6, 321.6, 210/650; 422/187
See application file for complete search history.

(56) References Cited

U.S. PATENT DOCUMENTS

| | | | |
|---|---|---|---|
| 6,203,762 B1 * | 3/2001 | Skalla et al. | 422/171 |
| 7,416,580 B2 * | 8/2008 | Nyman et al. | 95/90 |
| 8,012,446 B1 * | 9/2011 | Wright et al. | 423/437.1 |
| 2006/0272507 A1 * | 12/2006 | Johnson | 96/134 |
| 2008/0135495 A1 * | 6/2008 | Sher | 210/748 |

* cited by examiner

*Primary Examiner* — Duane Smith
*Assistant Examiner* — Christopher P Jones
(74) *Attorney, Agent, or Firm* — Ashok K. Janah; Janah & Associates, P.C.

(57) ABSTRACT

A filter for filtering a fluid in a substrate processing apparatus comprises first and second stages that are connected to one another. A delivery system provides a vaporized liquid to the filter. The first stage of the filter comprises a basic compound, and the second stage of the filter comprises a desiccant. A second filter comprises a permeation filter with permeable membrane to filter the fluid. Methods of filtering the fluid to reduce formation of undesirable process residues using the filter(s) are also described.

18 Claims, 7 Drawing Sheets

FLUID FILTRATION FOR SUBSTRATE PROCESSING CHAMBER

RELATED APPLICATION

The present application claims priority to U.S. Provisional Application No. 61/255,825 filed on Oct. 28, 2009, which is incorporated in its entirety by reference herein.

BACKGROUND

Embodiments of the present invention relate to the filtration of fluids, such as liquids, vaporized liquids or gases, which are used in substrate processing apparatus.

In the processing of substrates used in electronic and solar applications, semiconducting, dielectric, and conductor layers are formed or deposited on a substrate, such as a semiconductor wafer or panel. The substrate and layers can be etched to form patterns of features such as gates, vias, contact holes and interconnects. Other materials can also be formed on such substrates using processes such as chemical vapor deposition (CVD), physical vapor deposition (PVD), implantation, oxidation and nitridation. For example, in CVD processes, a process gas is used to deposit a layer of material on the substrate. In PVD processes, a target is sputtered to deposit material on the substrate. In oxidation and nitridation processes, a layer of oxide or nitride, such as silicon dioxide or silicon nitride, is formed by exposing the substrate to a suitable gaseous environment. In etching processes, a patterned etch-resistant mask of photoresist or hard mask is formed on the substrate by photolithographic methods, and the exposed portions of the substrate are etched by an energized gas.

In some of these processes, the substrate is exposed to a process gas comprising a vaporized liquid, liquid vapor transported by a carrier gas, or a gas. As an example, vaporized liquid can be formed by evaporating a liquid precursor or bubbling a carrier gas through a liquid, and transporting the vaporized liquid to the process chamber. For example, a liquid precursor such as TriMethyl Silane (TMS), OctaMethyl-CycloTetraSiloxane (OMTCS) or methyl-Diethoxy-Silane (mDEOS) can be vaporized and used to deposit a low-K dielectric material on the substrate. Low-k dielectric materials have a low dielectric constant "k" that is typically less than about 3, such as for example, compositions of silicon, oxygen, carbon, and hydrogen, for example BLACK DIAMOND™ available from Applied Materials, Santa Clara, Calif. As another example, a liquid precursor comprising titanium tetrachloride ($TiCl_4$) or tetrakisdimethyl-amidotitanium (TDMAT) can be used to deposit titanium-containing layers in a CVD process. As still another example, silicon oxide layers can be formed by evaporating a liquid precursor comprising tetraethylorthosilane (TEOS).

However, blockage and contamination problems often arise in the transportation and gas flow control of the liquid precursors themselves, the liquidized vapors, combinations of vapors and gases, or even just a gas by itself, to the process chamber. For example, in one process, a bubbler or boiler is used to transport vaporized liquid to the chamber by bubbling a carrier gas through a liquid precursor tank to form a stream of liquid vapor. However, the amount of vapor carried by the gas stream is difficult to control or measure because it depends on the downstream pressure, carrier gas flow rate, and the vapor pressure in the tank. Thus, complex multi-component delivery systems were developed to provide steady and continuous flow rates of vaporized liquid to a chamber, as for example, described in commonly assigned U.S. Pat. No. 6,783,118 to Sivaramakrishnan et al., filed on Jul. 31, 2001, and US Patent Application Publication No. 2003/0049933 A1 to Lei et al., filed on Mar. 13, 2003, both of which are incorporated by reference herein in their entireties. Such multi-component fluid delivery systems use vaporization valves, flow meters, and other control mechanisms to control the flow rate of the liquid or liquid vapor. However, many of these components have relatively narrow openings which can get clogged with residues of the liquid precursor or vapor causing variations in the vaporized liquid flow rates, until eventually the chamber is shut down for cleaning.

For reasons including these and other deficiencies, and despite the development of various vaporized liquid and fluid delivery systems, further improvements in such delivery systems and methods for supplying liquid precursors to substrate processing environments are continuously being sought.

SUMMARY

A filter can be used for filtering a fluid in a substrate processing apparatus. The filter comprises first and second stages that are connected to one another. The first stage comprises a basic compound, and the second stage comprises a desiccant.

A fluid delivery system comprises a liquid refill tank capable of holding a liquid precursor, the tank comprising an inlet to receive the liquid precursor, and an outlet to release the liquid precursor. A vaporizer is provided to convert the liquid precursor into a vaporized liquid. A filter comprises an inlet to receive the fluid comprising the liquid precursor or vaporized liquid, and an outlet to release filtered fluid.

A method of filtering a fluid for a substrate processing apparatus comprises exposing the fluid to a basic compound, and removing water from the fluid.

A permeation filter can also be used for filtering a fluid in a substrate processing apparatus. In one version, the permeation filter comprises a first compartment comprising an inlet to receive a process gas comprising the fluid and an outlet to release filtered fluid, a second compartment having a vacuum port capable of being connected to a vacuum system, and a permeable membrane separating the first compartment from the second compartment.

A fluid delivery system comprises a liquid refill tank capable of holding a liquid precursor, the tank comprising an inlet to receive the liquid precursor, an outlet to release the liquid precursor; and a filter wherein the inlet valve of the filter is connected to the liquid refill tank to receive the liquid A method of filtering a fluid for a substrate processing apparatus comprises passing a fluid past a surface of a permeable membrane, and maintaining a pressure differential across the permeable membrane, whereby impurities permeate through the permeable membrane.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1A:
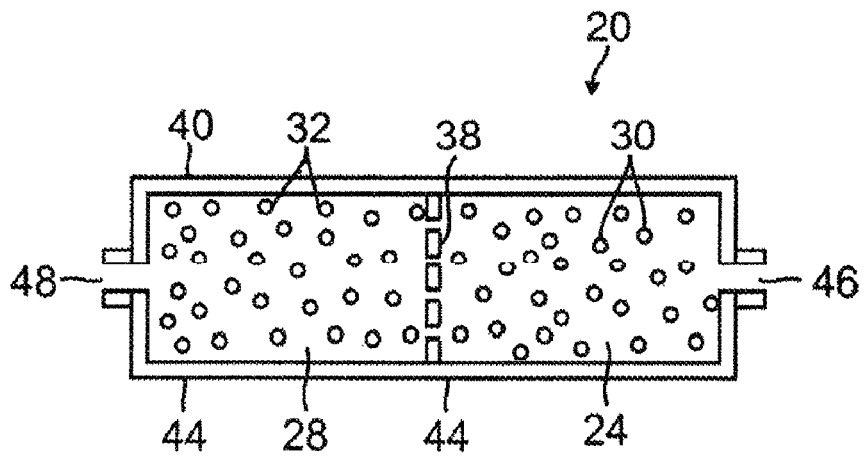
FIG. 1A is a sectional schematic view of an embodiment of a filter for a process chamber.

An exemplary embodiment of a filter 20 that filters a fluid, such as a liquid, vaporized liquid, liquid transported by a carrier gas, or a gas—for example, a vaporized or otherwise transported liquid that is used in a process chamber—is shown in FIG. 1A. The filter 20 is particularly useful for applications in which a fluid contains impurities or contaminants that would otherwise clog gas flow hardware and metering components with process residues. The contaminants combine with each other and/or react with internal surfaces of hardware components to form process residues in the fluid delivery system. The filter 20 filters and removes contaminants, including water, particles and gases. While an application of the filter 20 is provided to illustrate the present invention, it should be understood that other applications and uses as would be apparent to those of ordinary skill in the art are included in the scope of the present invention.

In the version shown, the filter 20 comprises a first stage 24 and a second stage 28. The first stage 24 contains a first material 30 that filters a first set of impurities from the fluid. The second stage 28 comprises a second material 32 that is a different material from the first material 30 to remove or extract a second set of impurities from the fluid. Thus, each stage 24, 28 performs a separate task, and the combination of stages 24, 28 can be used to perform more complete purification of the fluid. While a filter 20 with two stages is illustrated, the filter 20 can also comprise more than two stages, or include stages other than those described herein, without deviating from the scope and content of the present invention.

In one example, the filter 20 comprises a first stage 24 that contains a first material 30 comprising a basic compound. A basic compound is one which, when dissolved in water, gives a solution having a pH value of greater than 7. The basic compound is a substance that can accept protons, is an electron pair donor, or is a source of hydroxide anions. The basic compound removes contaminants such as hydrogen chloride from the fluid. For example, in one version, the first material 30 can include a basic compound that is a bicarbonate, carbonate, or hydroxide of an alkali or alkaline earth metal. The alkali metals can, for example, comprise any of the Group 1 (IUPAC style) elements of the periodic table, e.g., lithium (Li), sodium (Na), potassium (K), rubidium (Rb) or caesium (Cs). The alkaline earth metals include elements comprising Group 2 (IUPAC style) of the periodic table, e.g., beryllium (Be), magnesium (Mg), calcium (Ca), strontium (Sr), and barium (Ba). Suitable carbonates and bicarbonates include, for example, at least one of calcium carbonate, sodium carbonate and sodium bicarbonate. Sodium carbonate, for example, effectively removes hydrogen chloride containing impurities without generating excessive water or byproducts.

Another basic compound that can be used in the filter 20 is a metal hydroxide, e.g., barium hydroxide ($Ba(OH)_2$), calcium hydroxide ($Ca(OH)_2$), lithium hydroxide (LiOH), potassium hydroxide (KOH), or sodium hydroxide (NaOH). The hydroxide compounds also remove hydrogen chloride and impurities.

A second stage 28 of the filter 20 is fluidly connected to the first stage 24, and comprises a second material 32 that is not the same material as the first material 30 in the first stage 24. In one version, the second stage 28 comprises a desiccant. A desiccant is a hygroscopic substance that induces or sustains a state of dryness (desiccation) in its local vicinity in a moderately well-sealed environment by absorption and/or adsorption of water. The desiccant also removes ethanol, sodium chloride and carbon dioxide from the fluid. For example, ethanol is a common impurity from commercially available mDEOS.

Suitable desiccants include activated alumina, aerogel, bentonite clay, calcium chloride, calcium hydride, magnesium sulfate, magnesium perchlorate, sodium chlorate, sodium sulfate, silica gel, or mixtures thereof. In one version, the desiccant comprises silica gel, a solid, granular, porous form of silica made synthetically from sodium silicate. Silica gel is often available in the form of beads; however, other forms can also be used. The desiccant can also include activated alumina or porous polymers, both of which are useful for removing moisture from the fluid.

While the second stage 28 can be positioned before the first stage 24, placing the second stage 28 after the first stage 24 allows removal of water and/or ethanol and other materials from the fluid after it passes through the first material 30, ensuring that any water released into the fluid from or by reaction with the first material 30 is absorbed by the second material. However, in certain processes, the position of the first and second stages 24, 28 can be interchanged reversibly depending on the fluid composition after it passes through the first stage 24.

Optionally, a permeable membrane 38 separates the first and second stage 24, 28. The permeable membrane 38 allows the fluid comprising the vaporized liquid to pass through while preventing intermixing of the first and second materials 30, 32. A suitable permeable membrane 38 comprises sulfonated tetrafluoroethylene copolymer, such as Nafion.

In the version shown, a canister 40 surrounds the first stage 24 and second stage 28 to contain the first and second materials 30, 32. The canister 40 allows easy removal and replacement of the filter 20 when the filtration efficiency of the first and second materials 30, 32 is reduced or depleted. In the version shown, the canister 40 comprises a tube 44 having an inlet 46 proximate to the entrance of the first stage 24 and an outlet 48 proximate to the termination of the second stage 28. In one version, the canister 40 comprises a tube of a metal, such as stainless steel or aluminum.

Figure 1B:
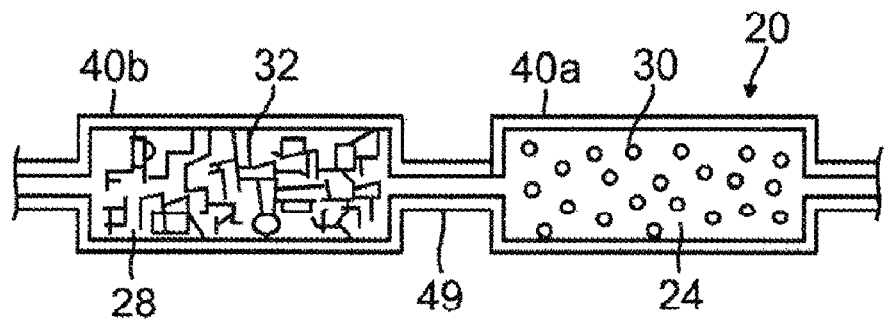
FIG. 1B is a sectional schematic view of another embodiment of a filter comprising multiple stages connected in a series arrangement.
Figure 1C:
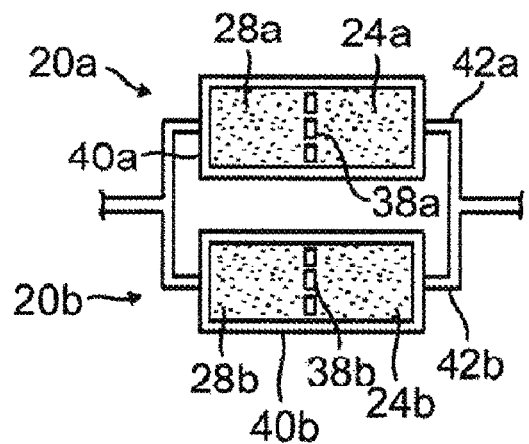
FIG. 1C is a sectional schematic view of dual filters operated in a parallel flow configuration.

In the version shown in FIG. 1A, a single canister 40 surrounds both the first stage 24 and the second stage 28. However, separate canisters 40a,b can also be used to separately contain each of the first and second stages 24, 28, as shown in FIG. 1B. In this version, the first canister 40a contains only the first stage 24 containing the first material 30. The second canister 40b contains only the second stage 28 comprising the second material 32. The system can avoid use of the permeable membrane 38. The canisters 40a,b can be spaced apart and joined with a tube 49 (as shown), or have male and female screw joints so that the canisters 40a,b can be screwed together (not shown).

In still another version, two filters 20a,b each comprise a canister 40a,b and are operated in a parallel arrangement, as shown in FIG. 10. In this version, each canister 40a,b contains both first and second stages 24a,b and 28a,b, respectively, as described above. Each of the first and second stages 24a, 28a and 24b, 28b, respectively, is separated by a permeable membrane 38a,b. The dual canister 40a,b can be used in combination with a system of dual lines 42a,b to provide a set of two filters 20a,b which operate in parallel so that the fluid flow can be switched from the first filter 20a to the second filter 20b, and vice versa, to reduce system down time when either one of the filters 20a,b needs to be cleaned, refurbished, or replaced.

Figure 2:
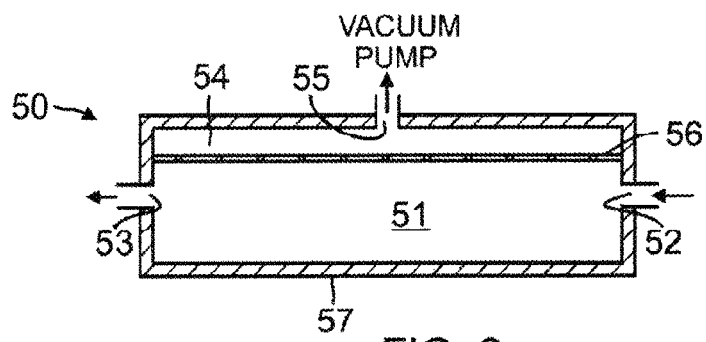
FIG. 2 is a sectional schematic view of an embodiment of a filter comprising a permeation filter.

In another aspect, a permeation filter 50 can also be used in addition to, or in substitution of, the filter 20 for filtering the fluid, an exemplary version being shown in FIG. 2. The permeation filter 50 comprises a first compartment 51 comprising an inlet 52 to receive the fluid comprising, for example, a liquid or vaporized liquid, and an outlet 53 to release filtered fluid. A second compartment 54 has a vacuum port 55 that is connected to a vacuum system comprising one or more vacuum pumps. A permeable membrane 56 separates the first compartment 51 from the second compartment 54 to allow impurities to filter through the membrane under a differential pressure applied across the permeable membrane 56. The differential pressure can be generated, for example, by maintaining a low pressure in the second compartment 54 using a vacuum pump connected to the vacuum port 55. The fluid flowing through the first compartment 51 is at a higher pressure, which depends upon the original pressures of the compressed gas tanks containing gases that are combined to form a process gas, the pressure of tanks of gas used to pump or otherwise transport a liquid, or the vapor pressure of vaporized liquid precursor. A suitable differential pressure is at least about 1 Bar. For example, a fluid can be maintained in the first compartment 51 at a pressure of from about 14 psi to about 45 psi, and the vacuum port 55 can maintain a vacuum by applying a vacuum pressure of from about 10 mTorr to about 5 Torr to the second compartment 54.

The permeable membrane 56 separates the first compartment 51 from the second compartment 54. In the version shown, the permeable membrane 56 extends longitudinally through the length of a permeation filter 50 that is a cylinder; however, the permeable membrane 56 may also be oriented in other directions, for example, angled or slanted within the permeation filter 50 in a longitudinal direction, or split into separate vertical sections oriented in a radial direction and suspended by other membranes, mesh, or wire support structures.

In one version, the permeable membrane 56 comprises a sulfonated tetrafluoroethylene copolymer or a tetrafluoroethylene backbone, e.g., ethanesulfonyl fluoride, 2-[1-[difluoro-[(trifluoroethenyl)oxy]methyl]-1,2,2,2-tetrafluoroethoxy]-1,1,2,2,-tetrafluoro-, with tetrafluoroethylene. This membrane operates by extracting $NH_3$, $NH_4^+$ from the fluid stream passing across the surface of the membrane. The extraction occurs because the membrane is highly conductive to cations and readily passes molecules of smaller molecular size.

The permeation filter 50 comprising the first and second compartments 51, 54 can be built into a canister 57 to allow easy removal and replacement. The canister 57 comprises a cylindrical tube which is capped at both ends and has holes for the inlet 52 and outlet 53. For example, the cylindrical tube can be made of stainless steel or aluminum. However, the canister 57 can also be adapted into other shapes or sizes appropriate to the design or layout of the substrate processing apparatus.

Figure 3A:
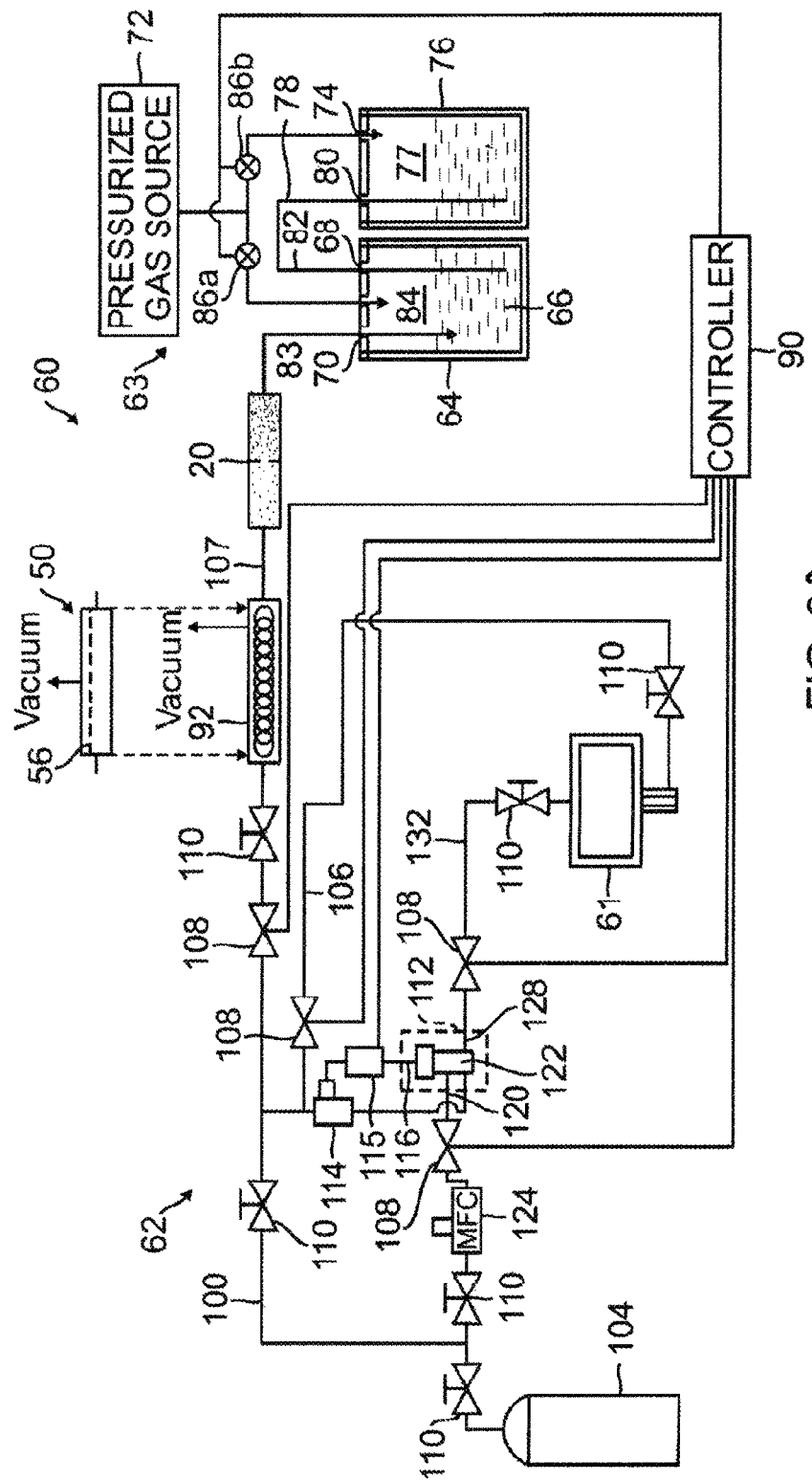
FIG. 3A is a schematic diagram of an exemplary embodiment of a substrate processing apparatus comprising a fluid delivery system for supplying a vaporized liquid precursor or carrier gas transported liquid precursor to a process chamber.

An embodiment of a substrate processing apparatus 60, comprising a process chamber 61 supplied by a fluid delivery system 62 that uses the filter 20 and/or permeation filter 50, is shown in FIG. 3A. The fluid delivery system 62 includes a fluid source, such as a liquid vaporization system 63 having at least one liquid refill tank 64 comprising a fluid such as the liquid precursor 66. The liquid refill tank 64 has a liquid inlet 68 to receive liquid precursor 66 and a liquid outlet 70 to release liquid precursor 66 to the filter 20. When the liquid precursor 66 in the liquid refill tank 64 becomes depleted, a pressurized gas from a pressurized gas source 72 is passed into an inlet 74 of a source tank 76 to fill a head space 77 above the level of the liquid precursor 66, causing the liquid precursor 66 to be pumped out from the source tank 76 through the dip tube 78 that connects the outlet 80 of the source tank 76 to the liquid inlet 68 and corresponding dip tube 82 of the liquid refill tank 64. A suitable pressurized gas comprises an inert or nonreactive gas, such as helium. The liquid refill tank 64 also has an inlet 83 into which a pressurized gas is pumped to pressurize a head space 84 at the top of liquid refill tank 64 and above the level of the liquid precursor 66, forcing the liquid precursor 66 out of the liquid refill tank 64 through the liquid outlet 70 and towards the filter 20. A pair of valves 86a,b can be used to direct the flow of pressurized gas to the liquid refill tank 64 and source tank 76, and a controller 90 can be used to control operation of the valves 86a,b, as described below. This dual tank system allows the liquid refill tank 64 to be refilled at any time during process operation without interrupting the process.

Figure 3B:
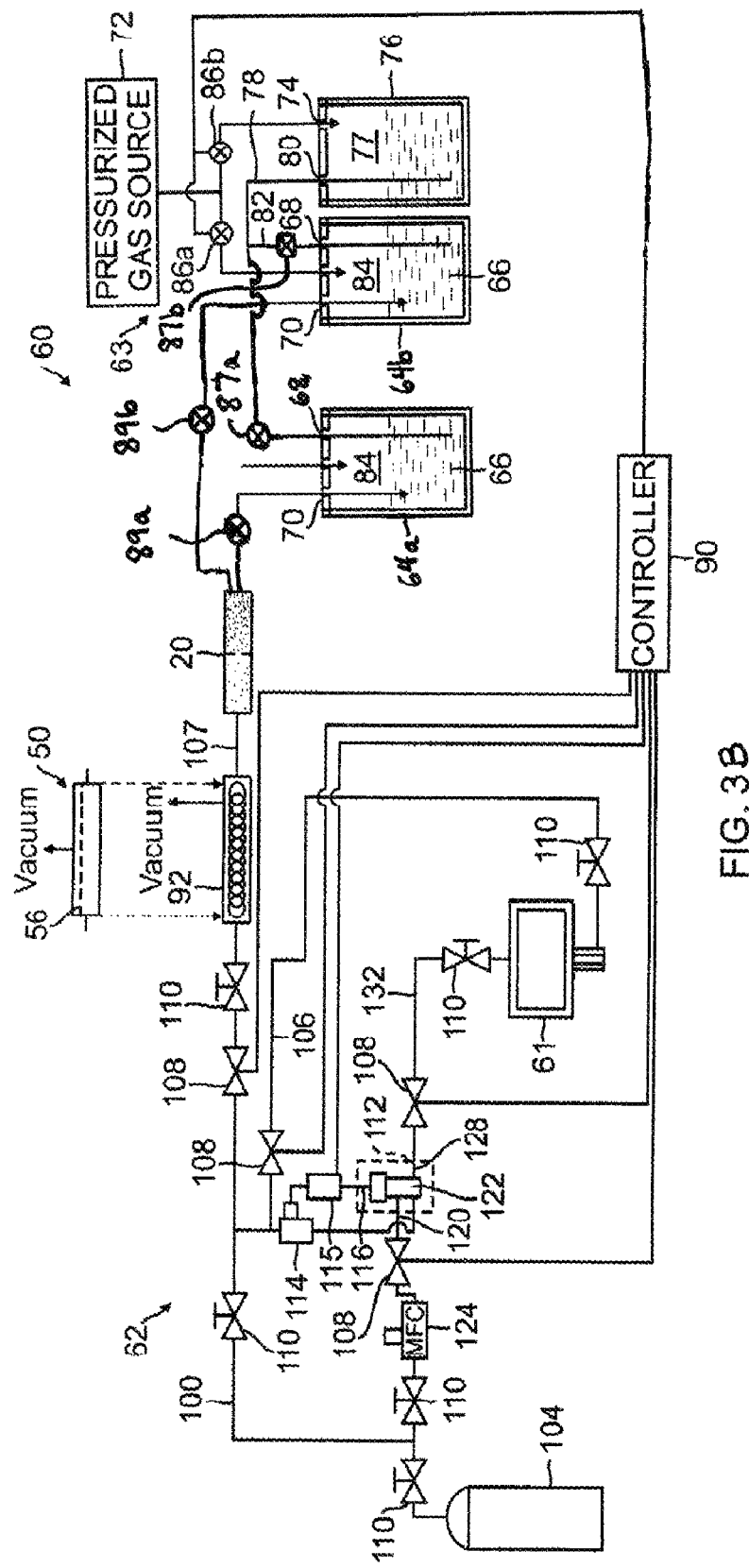
FIG. 3B is a schematic diagram of an alternate embodiment of the substrate processing apparatus of FIG. 3A comprising a pair of liquid refill tanks.

The substrate processing apparatus 60 can alternately comprise a fluid delivery system 62 having a plurality of liquid refill tanks, such as first and second liquid refill tanks 64a,b as shown in FIG. 3B. A fluid inlet valve 87a,b is connected to the source tank 76 and to one of the first and second liquid refill tanks 64a,b. A fluid outlet valve 89a,b is connected to the filter 20 which in turn is connected to the vaporizer 112 and then to the process chamber 61, and to one of the first and second liquid refill tanks 64a,b. The fluid inlet valves 87a,b and fluid outlet valves 89a,b are selectively operable to allow the first liquid refill tank 64a to provide process gas in the form of a fluid, such as a liquid, vaporized liquid or gas, via the filter 20 and optional vaporizer 112 to the process chamber 61 while the second liquid refill tank 64b is being filled with liquid from the source tank 76, and to allow the second liquid refill tank 64b to provide liquid via the filter 20 and optional vaporizer 112 to the process chamber 61 while the first liquid refill tank 64a is being filled with liquid from the source tank 76. The fluid delivery system 62 comprising a pair of liquid refill tanks 64a,b is also capable of refilling the liquid refill tanks without interrupting the supply of liquid precursor 66 to the process chamber 61.

In the versions shown in FIG. 3A-3B, the filter 20 is positioned between the liquid refill tank 64, 64a,b and a degasser 92, which is used to remove dissolved gases such as helium which may be present in a fluid such as the liquid precursor 66. In one version, the degasser 92 comprises Tetrafluoroethylene polymer.

In applications in which the fluid, such as the liquid precursor 66, is toxic or caustic, a purge line 100 is connected between the degasser 92 and a gas tank 104 to allow the operator to purge the liquid vaporization system 63 of the fluid (e.g., liquid precursor 66 and its vapor) before servicing any valves, vaporizers, or other components. To further reduce the amount of residual liquid precursor 66 in the system 63, a vacuum line 106 coupled to the vacuum system of the process chamber 61 can be used with the purge line 100 to evacuate residual liquid precursor 66 from the system.

When a permeation filter 50 is used in addition to, or in substitution of, the two-stage filter 20, the permeation filter 50 can be placed in the delivery line 107 between the liquid refill tank 64 and the process chamber 61. For example, the permeation filter 50 can be placed in the line 107 downstream of the filter 20. In another version, the permeation filter 50 is substituted for the degasser 92 to replace the degasser. In this version, the permeation filter 50 serves both to remove contaminants such as water and other materials from the fluid stream and also to degas the fluid.

Various valves such as remotely controllable valves 108 and manual valves 110 are inserted throughout the various lines of the fluid delivery system 62 and liquid vaporization system 63. The remotely controllable valves 108, such as pneumatic valves, can be controlled by the controller 90. The manual valves 110 can be closed manually if the remotely controllable valve 108 fails. The valves 108, 110 on the various lines enable normal operation as well as purge and evacuation operations.

The fluid delivery system 62 can vaporize the liquid precursor 66 provided by the liquid vaporization system 63 using a vaporizer 112. The vaporizer 112 can provide liquid flow control and vaporization at a single stage. Liquid flow rate is controlled by a closed loop system between a liquid flow monitor 114 and the vaporizer 112. The liquid flow monitor 114 is connected between the liquid refill tank 64 and a liquid inlet 116 of the vaporizer 112. During processing, a controlled amount of liquid is injected by the vaporizer 112, which converts the liquid to vapor by expansion and transports the vapor to a process chamber 61 by means of a carrier gas, such as helium, nitrogen or argon. A control signal from the liquid flow monitor 114 is fed back via control electronics 115 to the liquid flow control input of vaporizer 112. The pressurized gas tank 104 containing pressurized gas is connected to gas inlet 120 of the vaporizer 112 through a mass flow controller 124 which regulates the gas flow rate from the gas tank 104.

Suitable vaporizers 112 include liquid droplet vaporizers, atomizers, and other equivalent systems. For example, exemplary vaporizers are described in commonly assigned U.S. Pat. Nos. 7,055,809 to Sivaramakrishnan and 6,783,118 to Sivaramakrishnan et al., both of which are incorporated by reference herein in their entireties. In one embodiment, the vaporizer 112 comprises a liquid inlet 116 which receives a fluid comprising a liquid precursor 66. During operation, liquid precursor 66 enters the liquid inlet 116 where it is pressurized by the gas from the gas tank 104. In the vaporizer 112, a precursor liquid 66 is injected into a vaporizing area 122 where it sees a radial pressure drop within the vaporizing area and vaporizes by expansion. The vaporized liquid mixes with the pressurized gas provided by the gas tank 104 and flows out through outlet passage 128 to form a fluid which is transported via gas line 132 to the process chamber 61. To prevent the vaporized reactant liquid, which has been cooled due to expansion, from condensing on the walls of the vaporizer 112, the vaporizer 112 can be maintained at an elevated temperature by a surrounding heating jacket (not shown).

Figure 4:
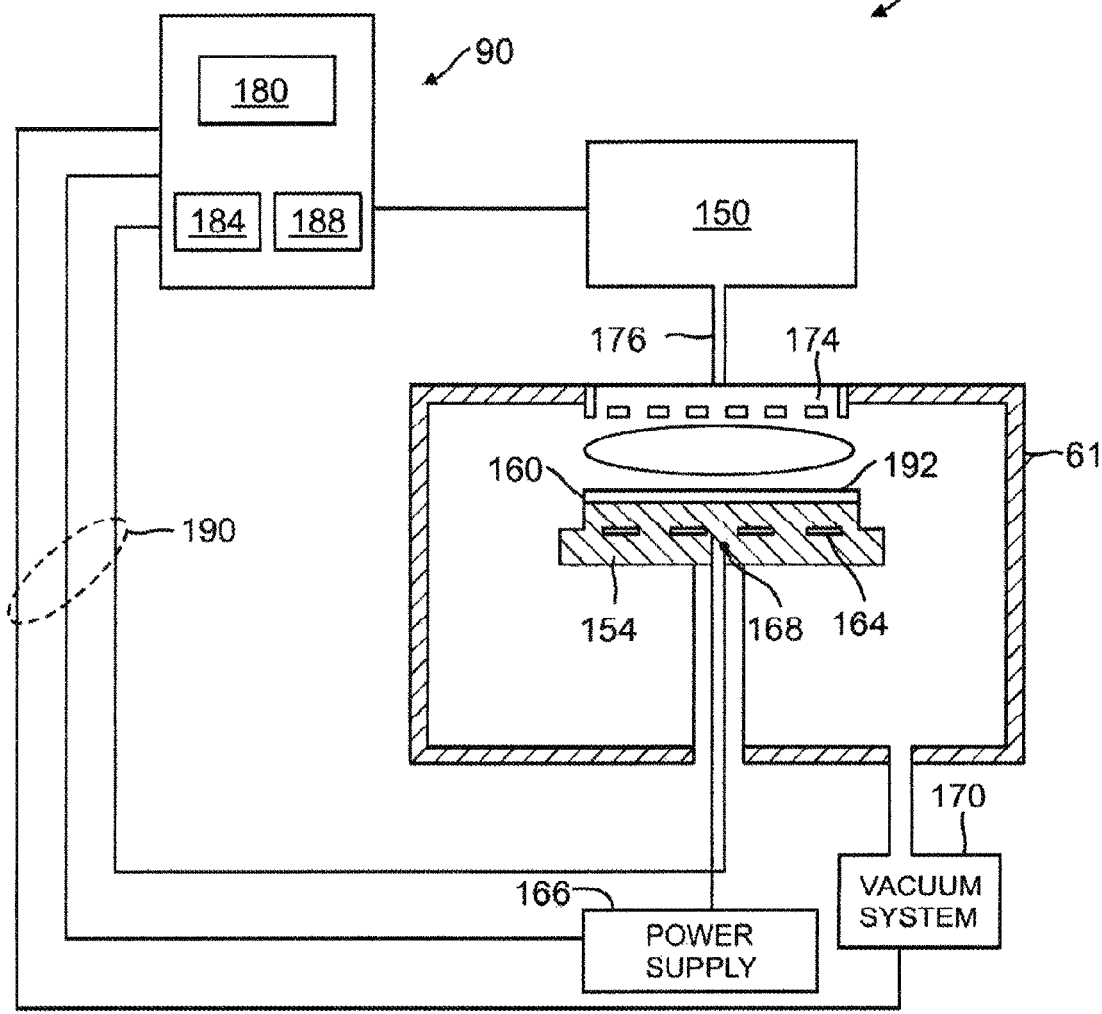
FIG. 4 is a schematic diagram of an exemplary process chamber of a substrate processing apparatus.

Exemplary embodiments of a substrate processing apparatus 60 and process chamber 61 that can use the filter 20 or permeation filter 50 include the CENTURA® systems, DxZ™ processing chamber, PRECISION 5000® systems, PRODUCER™ systems, and the PRODUCER SE™ processing chambers which are commercially available from Applied Materials, Inc., Santa Clara, Calif. A schematic diagram of an exemplary substrate processing apparatus 60 that can be used to perform amorphous carbon layer deposition is shown in FIG. 4. The apparatus 60 comprises a process chamber 61, controller 90, gas panel 150, and other hardware components such as power supplies and vacuum pumps. Such apparatus are described in commonly assigned U.S. Pat. No. 5,000,113, issued Mar. 19, 1991 to Adamik et al.; U.S. Pat. No. 4,668,365, issued May 26, 1987 to Foster et al.; U.S. Pat. No. 4,579,080, issued Apr. 1, 1986 to Benzing et al.; U.S. Pat. No. 4,496,609, issued Jan. 29, 1985 to Benzing et al. and U.S. Pat. No. 4,232,063, issued Nov. 4, 1980 to East et al., all of which are incorporated by reference herein in their entireties.

The process chamber 61 generally comprises a substrate support 154, which is used to support a substrate such as a substrate 160. This support 154 can be moved in a vertical direction inside the chamber 61 using a lifting mechanism (not shown). Depending on the process, the substrate 160 can be heated to a desired temperature prior to processing. The substrate support 154 is heated by an embedded heater 164. For example, the support 154 may be resistively heated by applying an electric current, such as an AC current, from a power supply 166 to the heater 164. The substrate 160 is, in turn, heated by the support 154. A temperature sensor 168, such as a thermocouple, is also embedded in the substrate support 154 to monitor the temperature of the support 154. The measured temperature is used in a feedback loop by the controller 90 to control the power supply 166 for the heater 164. The substrate temperature can be maintained at a temperature which is selected for the particular process application. The support 154 is optionally heated using a plasma or by radiant heat.

A vacuum system 170 is used to evacuate the process chamber 61 and to maintain the proper process gas flow rate and pressure inside the chamber 61. The vacuum system 170 comprises one or more vacuum pumps that can include roughing pumps and turbomolecular pumps.

A gas distributor 174, which is used to introduce a fluid that can be a liquid, vaporized liquid, carried gas transported liquid or liquid vapor, or gas—all of which is collectively termed a "process gas"—into the chamber 61, is located above the substrate support 154. The gas distributor 174 can comprise a showerhead structure and is connected by gas lines 176 to a gas panel 150, which controls and supplies the process gas used in different steps of the process sequence. The gas panel 150 controls the composition and flow rate of the process gas, which can include the vaporized liquid precursor 66 as well as other gases, such as carrier gases, and reactant gases. The process gas deposits a layer on the surface 192 of the substrate 160.

The gas distributor 174 and substrate support 154 can also form a pair of spaced apart electrodes which can be used to energize a plasma from the process gas. When an electric field is generated between these electrodes, the process gases introduced into the chamber 61 are ignited into a plasma. Typically, the electric field is generated by connecting the substrate support 154 to a source of single-frequency or dual-frequency radio frequency (RF) power (not shown) through a matching network (not shown). Alternatively, the RF power source and matching network may be coupled to the gas distributor 174, or coupled to both the gas distributor 174 and the substrate support 154.

Proper control and regulation of the fluid flow through the gas panel 150 is performed by various valves 108, 110 and vaporizers 112 (as shown in FIG. 3A-3B) and controlled by a controller 90. For example, the controller 90 can include a central processing unit (CPU) 180, support circuitry 188, and memories 184 containing control software. The controller 90 automates control of the numerous steps required for substrate processing, such as substrate transport, gas flow control, liquid flow control, temperature control, and chamber evacuation. Bi-directional communications between the controller 90 and the various components of the apparatus 60 are handled through numerous signal cables collectively referred to as signal buses 190.

The following examples are provided to illustrate exemplary applications of the filter 20 and fluid delivery system 62. However, these examples should not be used to limit the scope of the present invention.

Example 1

This example identifies the nature of the process residues formed within the nozzles and passageways of components of the fluid delivery system 62. In this process, a dielectric film was deposited on a substrate using a process gas comprising a vaporized liquid precursor 66 that includes mDEOS. The mDEOS containing the first liquid precursor 66 is held in a liquid refill tank 64 and a conventional apparatus 60 was operated without a filter 20 or permeation filter 50. As a result, after about 2000 process cycles, the vaporizer 112 used to vaporize the liquid mDEOS became clogged with process residues. These residues were analyzed by scanning electron microscope (SEM) and infrared spectroscopy.

Figure 5:
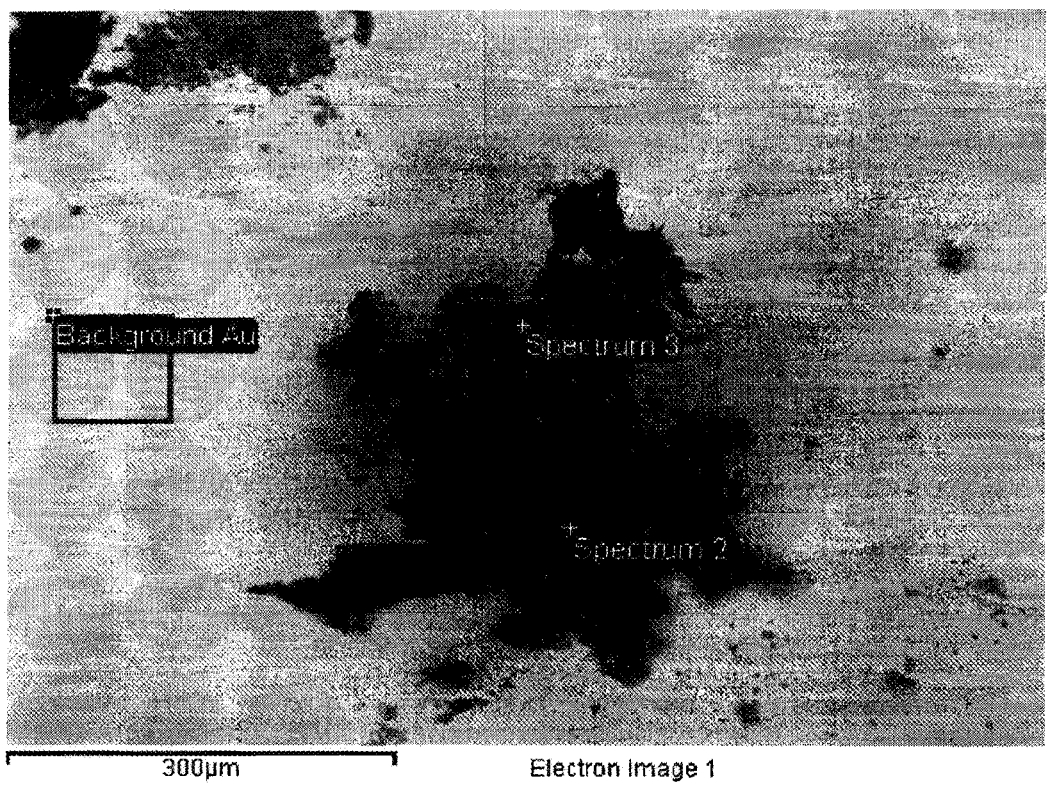
FIG. 5 is a micrograph of solid residue found on a vaporizer.
Figure 6A:
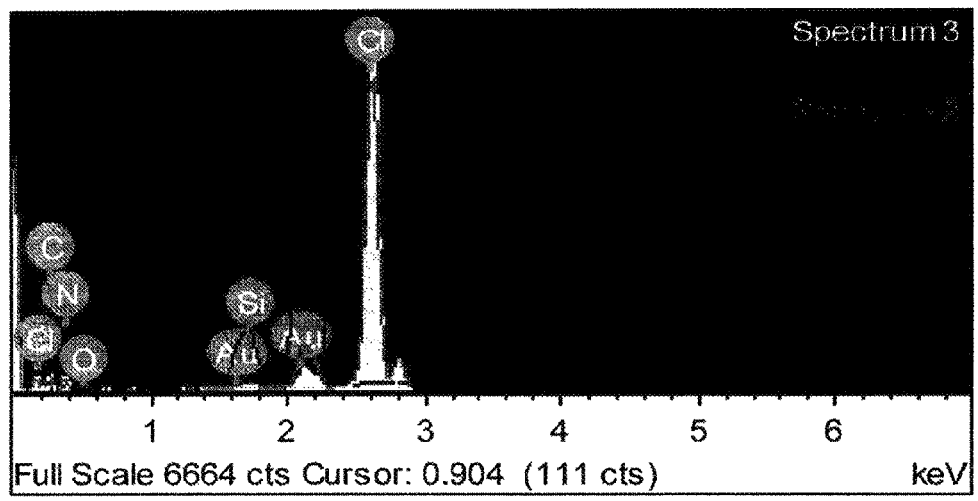
FIGS. 6A and 6B are graphs showing EDX analysis of the solid residue.
Figure 6B:
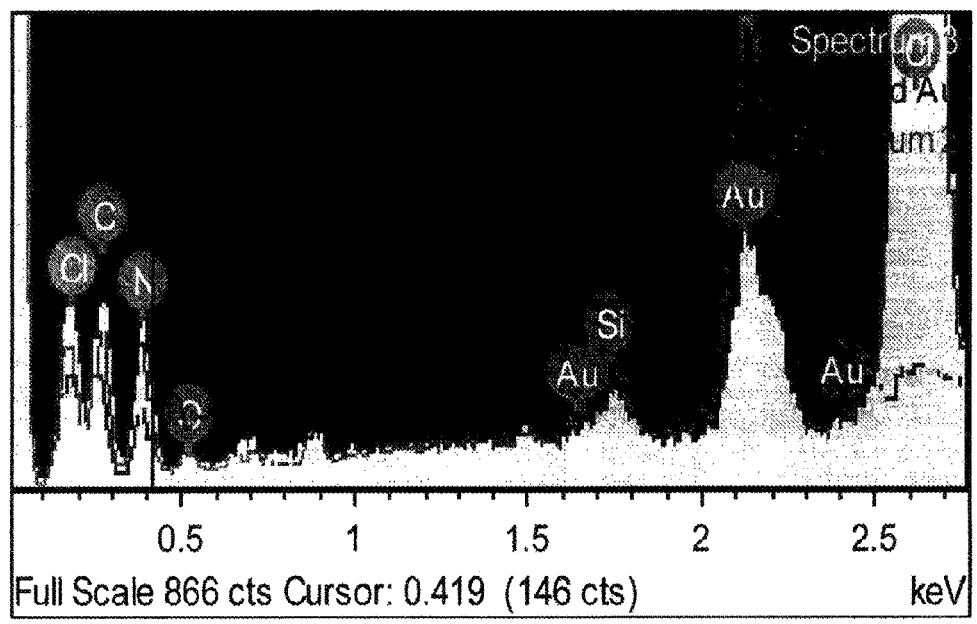
Figure 7A:
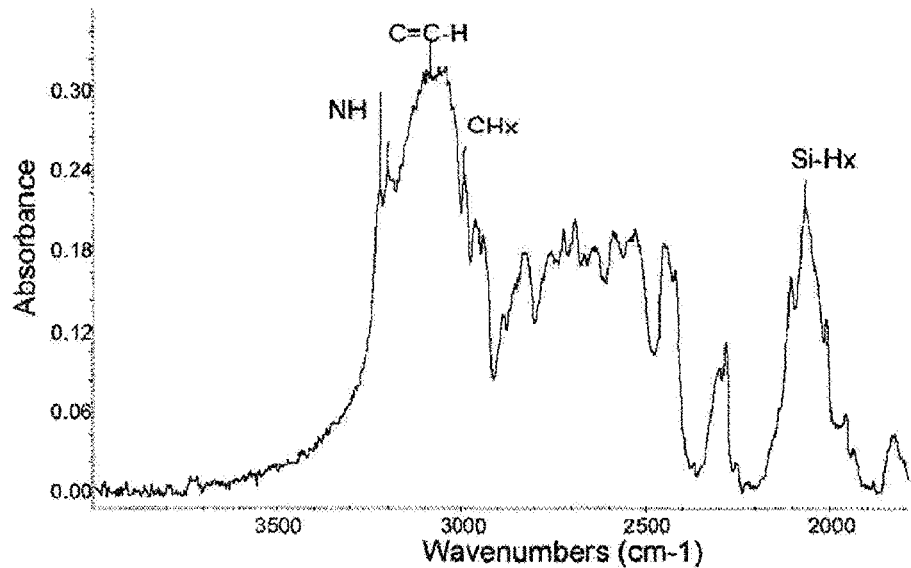
FIGS. 7A and 7B are graphs showing a Fourier transformed infrared analysis (FT-IR) of the solid residue.
Figure 7B:
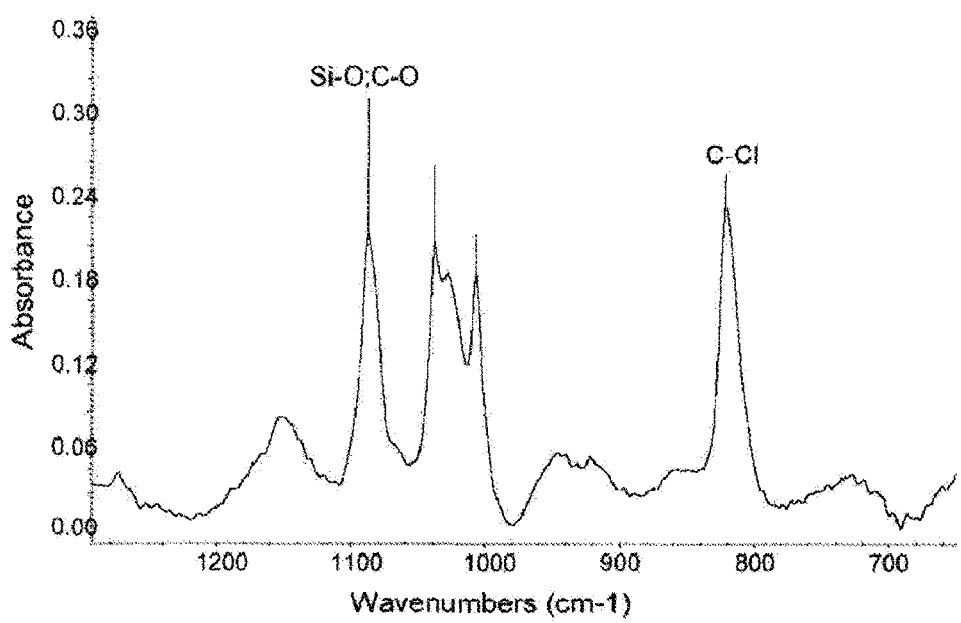

FIG. 5 shows an scanning electron microscope (SEM) micrograph of the process residues visible on a section of the inside surface of the vaporizer 112. The process residues were found to deposit primarily on the internal tubes of the vaporizer 112. Thereafter, EDX (energy dispersive X-ray) analysis was performed on these process residues to identify their chemical composition, as shown in FIGS. 6A and 6B. The EDX analysis was performed in the SEM by bombarding the process residue with an electron beam causing X-rays to be emitted from the process residue specimen. The resultant EDX spectrum shows a plot of the frequency of X-ray emissions received for each energy level, in which each of the detected X-ray peaks is unique to a single element. The EDX spectrums demonstrate that the process residues deposited inside the vaporizer valve were amine-HCl salts.

Without being restricted by the same, the presence of amine-HCl salts in the process residues were understood as follows. Hydrogen chloride (HCl) is a common impurity that results in the synthesis of mDEOS from chloro-silanes as follows:

$$Si + 3HCl \rightarrow HSiCl_3 + SiCl_4 + H_2$$

$$MeMgCl + HSiCl_3 \rightarrow MeHSiCl_2 + MgCl_2 (Me=CH_3)$$

$$MeHSiCl_2 + 2C_2H_5OH \rightarrow mDEOS + 2HCl$$

Thus, the major products of this synthesis reaction include HCl, ethanol (C2H5OH), methyl-triethoxy-silane, and methoxy-triethoxy-silane.

Further, the amine component in the liquid mDEOS may also have originated from chemical stabilizers used to remove the HCl impurities from the synthesized liquid mDEOS. For example, amine stabilizers are added to mDEOS tanks for shipping and storage because they reduce Si—H bond break down and resultant self polymerization. However, when the HCl concentration in the liquid mDEOS is relatively high, the HCl present in the liquis mDEOS reacts with the amines added to the tank as follows:

$$R\text{---}NH_2 + HCl \rightarrow R\text{---}NH_3{+}{+}Cl\text{---} \text{ (in liquid mDEOS precursor)}$$

$$R\text{---}NH_2 + HCl \rightarrow R\text{---}NH_3Cl \text{(solid after mDEOS vaporized)}$$

The R—NH$_3$Cl compound was a solid process residues.

The hypothesis that the liquid mDEOS contained both amines and HCl was further verified by analyzing the typical impurity concentration in liquid mDEOS after purification. The analysis revealed that the liquid mDEOS contained ethanol <300 ppm; chlorides (such as HCl) <2 ppm; organic amines <5 ppm; and water <15 ppm. Lower grade mDEOS were found to contain higher amounts of the HCl and/or amine impurities. Thus, it was discovered that HCl and/or amine impurities in the liquid mDEOS precursor appeared to be causing deposition of the clogging process residues inside the vaporizer valve.

Example 2

A two-stage filter 20 was constructed to remove the previously identified process residues. The two-stage filter 20 included a first stage 24 containing a first material 30 that is a basic compound, and a second stage 28 containing a second material 32 that is a desiccant. The filter 20 was used to purify a fluid comprising liquid mDEOS to removal HCl and/or amine.

In this version, the filter 20 included a first stage 24 containing a basic compound comprising sodium carbonate, which would remove HCl as follows:

$$HCl + Na_2CO_3 \rightarrow NaCl + NaHCO_3$$

$$HCl + NaHCO_3 \rightarrow NaCl + H_2O + CO_2$$

Other basic compounds that would work well in this application include sodium bicarbonate, calcium carbonate, and sodium hydroxide; however, these compounds generally create more water byproducts.

The filter 20 further contained a second stage 28 containing a second material 32 comprising a desiccant consisting of silica gel. The silica gel adsorbs or absorbs water, NaCl, and CO$_2$. It also can remove ethanol, which is another impurity present in the liquid mDEOS precursor material. However, activated alumina and porous polymers can also be used as the desiccant.

The filter 20 was installed in the apparatus 60, as shown in FIG. 3. It was found that by using the filter, 10,000 process cycles could be performed without residues clogging the vaporizer 112. This represented an increase by a factor of 5 of chamber operation cycles without cleaning, representing a significant improvement over the prior art.

Embodiments of methods and systems for performing chemical vapor deposition using the filter 20 offered a number of advantages over conventional systems. For example, while conventional CVD process required halting after less than 2,000 process cycles to allow periodic cleaning or change-out of the vaporizer 112, use of the filter 20 allowed continuous processing for at least 10,000 cycles without interruption. Another benefit was that the system did not need to be manually handled or ensured to be purged of the liquid precursor 66 prior to cleaning of the vaporizer 112, and this increased the overall safety of the system.

The present invention has been described with reference to illustrative embodiments thereof; however, other versions are possible. For example, the filter 20 can be used in other process chambers or processing methods as would be apparent to one of ordinary skill in the art. Further, alternative steps equivalent to those described for the filtering or liquid vaporizing process can also be used as would be apparent to one of ordinary skill. Therefore, the spirit and scope of the appended claims should not be limited to the description of the preferred versions contained herein.

What is claimed is:

1. A filter for filtering a fluid in a substrate processing apparatus, the filter comprising: (a) a first stage comprising a basic compound; (b) a second stage connected to the first stage, the second stage comprising a desiccant; and (c) a permeable membrane separating the first and second stages.

2. A filter according to claim 1 wherein the basic compound comprises a bicarbonate, carbonate, or hydroxide compound.

3. A filter according to claim 2 wherein the basic compound comprises an alkali metal or an alkaline earth metal.

4. A filter according to claim 1 wherein the desiccant comprises silica gel.

5. A filter according to claim 1 comprising a canister surrounding the first and second stages, the canister comprising an inlet proximate to the first stage, and an outlet proximate to the second stage.

6. A filter according to claim 5 that is capable of maintaining a pressure differential of at least about 1 Bar.

7. A filter according to claim 1 wherein the permeable membrane comprises a sulfonated tetrafluoroethylene copolymer or a tetrafluoro-ethylene backbone.

8. A fluid delivery system comprising:
   (a) a liquid refill tank capable of holding a liquid precursor, the tank comprising an inlet to receive the liquid precursor, and an outlet to release the liquid precursor;
   (b) a vaporizer to convert the liquid precursor into a vaporized liquid; and
   (c) a filter according to claim 1, the filter comprising an inlet to receive fluid comprising the liquid precursor or vaporized liquid, and an outlet to release filtered fluid.

9. A system according to claim 8 comprising:
   (1) first and second liquid refill tanks and a source tank;
   (2) a fluid inlet valve connected to the source tank and to one of the first and second liquid refill tanks; and
   (3) a fluid outlet valve connected to the filter and one of the first and second liquid refill tanks, the fluid inlet valve and the fluid outlet valve selectively operable to allow the first liquid refill tank to provide the precursor liquid to the filter while the second liquid refill tank is being filled with precursor liquid from the source tank, and to allow the second liquid refill tank to provide precursor liquid to the filter while the first liquid refill tank is being filled with precursor liquid from the source tank.

10. A filter for filtering a fluid in a substrate processing apparatus, the filter comprising: (a) a first stage comprising a compound that is a bicarbonate, carbonate, or hydroxide; (b) a second stage connected to the first stage, the second stage comprising a desiccant; and (c) a permeable membrane separating the first and second stages.

11. A filter according to claim 10 wherein the compound comprises an alkali metal or an alkaline earth metal.

12. A filter according to claim 10 wherein the desiccant comprises silica gel.

13. A filter according to claim 10 comprising a canister surrounding the first and second stages, the canister comprising an inlet proximate to the first stage, and an outlet proximate to the second stage.

14. A fluid delivery system comprising:
   (a) a liquid refill tank capable of holding a liquid precursor, the tank comprising an inlet to receive the liquid precursor, and an outlet to release the liquid precursor;
   (b) a vaporizer to convert the liquid precursor into a vaporized liquid; and
   (c) a filter comprising an inlet to receive fluid comprising the liquid precursor or vaporized liquid, and an outlet to release filtered fluid, the filter comprising:
      (i) a first stage comprising a compound that is a bicarbonate, carbonate, or hydroxide; and
      (ii) a second stage connected to the first stage, the second stage comprising a desiccant.

15. A system according to claim 14 comprising:
   (1) first and second liquid refill tanks;
   (2) a source tank;
   (3) a fluid inlet valve connected to the source tank and to one of the first and second liquid refill tanks; and
   (4) a fluid outlet valve connected to the filter and one of the first and second liquid refill tanks, the fluid inlet valve and the fluid outlet valve selectively operable to allow the first liquid refill tank to provide the precursor liquid to the filter while the second liquid refill tank is being filled with precursor liquid from the source tank, or to allow the second liquid refill tank to provide precursor liquid to the filter while the first liquid refill tank is being filled with precursor liquid from the source tank.

16. A system according to claim 14 wherein the filter comprises a desiccant that is silica gel.

17. A system according to claim 14 wherein the filter comprises a canister surrounding the first and second stages, and a permeable membrane separating the first and second stages.

18. A system according to claim 17 wherein the permeable membrane comprises a sulfonated tetrafluoroethylene copolymer or a tetrafluoro-ethylene backbone.

* * * * *